United States Patent
Turnquist et al.

(10) Patent No.: US 6,678,643 B1
(45) Date of Patent: Jan. 13, 2004

(54) EVENT BASED SEMICONDUCTOR TEST SYSTEM

(75) Inventors: James Alan Turnquist, Santa Clara, CA (US); Shigeru Sugamori, Santa Clara, CA (US); Hiroaki Yamoto, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/340,371

(22) Filed: Jun. 28, 1999

(51) Int. Cl.$^7$ ............................................. G06F 11/00
(52) U.S. Cl. ............................ 703/14; 703/17; 703/27; 714/738; 714/742
(58) Field of Search ............................ 703/14, 17, 24, 703/25, 26, 27; 714/724, 738, 735, 739, 742, 734, 731; 324/158.1; 716/6; 717/176, 177; 365/201

(56) References Cited

U.S. PATENT DOCUMENTS

| | | | | |
|---|---|---|---|---|
| 6,061,283 A | * | 5/2000 | Takahashi et al. | 365/201 |
| 6,249,891 B1 | * | 6/2001 | Matsumura et al. | 714/738 |
| 6,331,770 B1 | * | 12/2001 | Sugamori | 324/158.1 |
| 6,345,373 B1 | * | 2/2002 | Chakradhar et al. | 714/738 |
| 6,360,343 B1 | * | 3/2002 | Turnquist | 714/731 |
| 6,363,509 B1 | * | 3/2002 | Parulkar et al. | 714/738 |
| 6,370,494 B1 | * | 4/2002 | Mizuno et al. | 703/17 |
| 6,370,675 B1 | * | 4/2002 | Matsumura et al. | 716/6 |
| 6,557,133 B1 | * | 4/2003 | Gomes | 714/738 |

* cited by examiner

Primary Examiner—Samuel Broda
Assistant Examiner—Thai Phan
(74) Attorney, Agent, or Firm—Muramatsu & Associates

(57) ABSTRACT

A semiconductor test system which generates a test pattern produced based on data resultant to device logic simulation performed on a computer for an LSI device designed in an electronic design automation (EDA) environment, tests the LSI device, and feedbacks the test results to the EDA environment. The semiconductor test system includes an event file for storing event data obtained by executing device logic simulation in a design stage of an LSI device under test; an event memory for storing the event data from the event file relative to timings; means for generating a test pattern by directly using the event data from the event memory and applying the test pattern to the LSI device under test; a result data file for evaluating a response output of the LSI device under test and storing resultant evaluation data; and means for evaluating design of the LSI device based on the data stored in the result data file.

8 Claims, 12 Drawing Sheets

EVENT BASED SEMICONDUCTOR TEST SYSTEM

FIELD OF THE INVENTION

This invention relates to a semiconductor design and test system for designing and testing semiconductor integrated circuits such as a large scale integrated (LSI) circuit, and more particularly, to an event based semiconductor IC design and test system for testing a semiconductor IC by generating an event based test pattern produced directly from logic simulation data produced in a design stage of the semiconductor IC through a CAD (computer aided design) process.

BACKGROUND OF THE INVENTION

FIG. 1 is a schematic block diagram showing an example of a semiconductor test system for testing a semiconductor integrated circuit (hereafter may also be referred to as "IC device", "LSI under test" or "device under test").

In the example of FIG. 1, a test processor 11 is a dedicated processor provided within the semiconductor test system for controlling the operation of the test system through a tester bus. Based on pattern data from the test processor, a pattern generator 12 provides timing data and waveform data to a timing generator 13 and a wave formatter 14, respectively. A test pattern is produced by the wave formatter 14 with use of the waveform data from the pattern generator 12 and the timing data from the timing generator 13, and is supplied to a device under test (DUT) 19 through a driver 15.

A response signal from the DUT 19 resulted from the test pattern is converted to a logic signal by an analog comparator 16 with reference to a predetermined threshold voltage level. The logic signal is compared with expected value from the pattern generator 12 by a logic comparator 17. The result of the logic comparison is stored in a fail memory 18 corresponding to the address of the DUT 19. The driver 15, the analog comparator 16 and switches (not shown) for changing pins of the device under test are provided in a pin electronics 20.

In a process of developing semiconductor integrated circuits such as a large scale integrated (LSI) circuit, almost always, a design method using a computer aided design (CAD) tool is employed. Such a design environment using a CAD tool is also referred to as an electronic design automation (EDA) environment.

In such a semiconductor development process in an EDA environment, desired semiconductor circuits are created in an LSI with the use of a hardware description language such as VHDL and Verilog. Also in this process, functions of the semiconductor circuits thus designed are evaluated on a computer with use of a software simulator called a device logic simulator.

A device logic simulator includes an interface commonly called a testbench through which test data (vector) is applied to the device design data (device model) showing the intended semiconductor circuits, and the resultant responses of the intended semiconductor circuits are evaluated.

After the design stage of the LSI circuit, actual LSI devices are produced and are tested by a semiconductor test system such as an LSI tester to determine whether the LSI devices perform the intended functions properly. As noted above, an. LSI tester supplies a test pattern (test vector) to an LSI device under test and compares the resultant outputs of the LSI device with expected data to determine pass/fail of the LSI device.

For testing an LSI device which has a higher level of functionality and density, a test pattern to be applied to the LSI device must accordingly be complex and lengthy, resulting in significantly large workloads and work hours in producing the test pattern.

Thus, to improve an overall test efficiency and productivity of the semiconductor integrated circuits, an attempt has been made to use the data produced through the execution of the device logic simulator in an actual test of the semiconductor integrated circuits. This is because the test procedure performed by the LSI tester in testing an actual semiconductor integrated circuit has a substantial similarity with a test procedure by the device logic simulator in testing the design data of the semiconductor circuit in the CAD process noted above.

For example, an attempt is made to produce test patterns and expected value patterns for an LSI tester to test the intended semiconductor integrated circuits by utilizing the data (dump file) resultant from executing the device logic simulation. FIG. 2 is a schematic diagram showing an overall relationship between a design stage of a semiconductor integrated circuit and a test stage of the semiconductor integrated circuit. This example shows a situation where a very large scale integrated circuit (LSI), such as a system-on-chip (SoC) 23 is designed under an electronic design automation (EDA) environment.

After designing the semiconductor integrated circuit 23 under the EDA environment, it is obtained a design data file and a test data file 33. Through various data conversion processes, the design data is converted to physical level data indicating each gate in the designed semiconductor integrated circuit. Based on the physical level data, an actual integrated circuit 29 is produced in a semiconductor integrated circuit production process (silicon process).

The integrated circuit thus produced is tested by a semiconductor test system 30. By executing a logic simulation by a testbench 34 with use of the test data derived through the design stage of the integrated circuit, a data file 35 showing input-output relationships in the integrated circuit is created. An example of such a data file is VCD (Value Change Dump) of Verilog.

As will be described in more detail later, a format conversion process is performed by a conversion software 37 so that the VCD data file 35 described in an event base format is converted to a test signal of a cycle base format. As a consequence, a test pattern in the cycle base is stored in a file 38 in the semiconductor test system 30. A hardware tester 39 applies the test pattern to the device under test 29 for testing the device functions and the like.

As briefly mentioned above, in such logic simulation data, test patterns to be applied to a device model as well as the resultant outputs (expected value patterns) of the device model are expressed by an event base format. Here, the event base data expresses the points of change (events) in a test pattern from logic "1" to logic "0" or vice versa with reference to the passage of time. Generally, such time passages are expressed by time lengths from a predetermined reference point (absolute time difference) or a time length from a previous event (relative time difference).

In contrast, in an actual LSI tester (semiconductor test system), test patterns are described by a cycle base format. In the cycle base format data, each variable in a test pattern is defined relative to each test cycle (tester rate) of the LSI tester. Thus, as will be explained in more detail later, in a typical LSI tester, a test pattern for a corresponding test cycle is formed based on descriptions of a test cycle (tester rate), waveform (kind of waveform and edge timings), and vector in test pattern data.

As in the foregoing, the existing LSI testers deal with the data in the cycle base while the data produced through the EDA environment is in the event base. Thus, to effectively create test patterns for testing semiconductor devices actually produced based on the CAD data obtained in the design stage of the semiconductor device, it is necessary to convert the event base data to the cycle base data.

Accordingly, in. FIG. 2 noted above, the conversion software 37 extracts the pattern data and timing data from the dump file 35 which is derived from executing the device logic simulation in the design stage of the semiconductor device. The conversion software 37 converts the extracted data to the cycle base data. The pattern data and timing data thus converted to the cycle base format include descriptions regarding the test cycles (tester rate), waveforms (types of waveforms, edge timings), and vectors. The pattern data and timing data are stored in the pattern file 38 in the test system 30.

Based on the data stored in the pattern file 38, the tester 39 which is a cycle based test system generates test patterns to be applied to the DUT 29. As noted above, the test patterns for the existing LSI testers are formatted with use of the test cycle (tester rate) data, waveform (types of waveforms, edge timings) data, and vector data contained in the pattern data and the timing data.

The structure of the cycle based data is shown in FIG. 3. In the example of FIG. 3, the cycle based test patterns are stored in a test pattern file 41 and a test plan file 42. By using the data from these files, an intended test pattern shown in waveforms 45 is formatted by the wave formatter 14 of FIG. 1. Here, the test pattern file 41 stores vector data (also called pattern data) and the test plan file 42 stores the timing data, i.e., the data concerning the test cycles (tester rate) and waveforms (types of waveforms and edge timings).

In FIG. 3, to format the intended waveform 45, vector data such as "1", "0", and "X" is set in a pattern description 46, and waveforms and delay data for each test cycle are set in a timing data description 47. The above data need to be defined for each test cycle.

On the other hand, the data produced in the LSI design stage under the EDA environment, such as the data resulted from performing the device logic simulator, has the event based data structure as noted above, which is substantially different from the data structure of the cycle based data of FIG. 3. Such a situation is further explained with reference to FIG. 4. In this example, waveforms 58 in FIG. 4 illustrate the event data from a dump file 57, which is derived from executing the logic simulation, in an event timing sequence. Namely, the event data in the dump file 57 expresses each changing point of the waveforms 58 by a list of set (drive high) and reset (drive low) relative to time.

With reference to FIG. 4, a brief description is made regarding a process of forming the dump file. In designing an LSI under the EDA environment, the designed data is expressed in different levels (hierarchy) of description. In a higher level, more functional description is used, which is converted to lower levels so that in the lowest level, the description in the designed data is in the level of gates of physical structure of the semiconductor device. In FIG. 4, an RTL file 54 stores design data described in a register transfer language (RTL). The RTL design data is converted by conversion software 55 to net list data which is stored in a net list file 56. The net list is a type of data describing the connection relationship among gates which is more closer to the physical structure of the semiconductor device than the RTL design data.

Based on such design data, a testbench 51 provides test vectors to, for example an HDL simulation 52 or a gate level simulation 53 to verify the design data. As a result of the design data evaluation, the dump file noted above is provided with the data describing input events, output events which correspond to the input events, and times of such events.

As in the foregoing, test patterns for testing the designed LSI is created by using the data obtained in the CAD design stage of the LSI, for example, the design evaluation data obtained by executing the device logic simulator produced in the design stage of the LSI devices. However, because such a process involves the test pattern conversion between the different data structures (event base versus cycle base), and further because the functional limitations in the hardware and software of the LSI tester, the event based design evaluation data cannot completely be converted to the cycle based test pattern data.

As a consequence, in testing the semiconductor device with use of the test pattern converted from the design evaluation data, problems in the semiconductor device under test may not always be discovered. In other words, a defect detection rate (debug efficiency) may be decreased. For converting to a more complete test pattern, longer times and heavier workload must be invested, which increases a test cost (overhead) and decreases a test efficiency.

Further, in the conventional semiconductor test system, as in the foregoing, various parameters such as the test cycles, test signal waveforms, timings and logic vectors must be separately described in the pattern data and the timing data. Therefore, to generate the test patterns based on the descriptions separately provided, complicated and expensive hardware and software must be used.

Thus, there is a need in the industry of a high efficiency semiconductor design and evaluation system which can generate test patterns and evaluate the semiconductor device under test, based on the same way of thinking as the evaluation data derived from the EDA environment, and feedback the test result to the EDA environment. It is also desired in the industry to further decrease a time length required for LSI design and its evaluation with use a new semiconductor test system with such a new concept.

SUMMARY OF THE INVENTION

Therefore, it is an object of the present invention to provide a semiconductor test system for generating a test pattern by directly using logic simulation data of an LSI device under test or test data in the data structure (event base) similar to the logic simulation data which are formed in the design stage of the LSI under an electronic design automation (EDA) environment and testing the LSI device under test.

It is another object of the present invention to provide an event based semiconductor test system which is capable of producing a test pattern for testing an LSI device under test by directly using the event based simulation data created based on the CAD data derived from the design stage of the intended LSI device under test.

It is a further object of the present invention to provide a semiconductor test system which is capable of producing a test pattern for testing an LSI device under test by directly using the event based simulation data created based on the CAD data derived from the design stage of the intended LSI device under test, thereby substantially reducing a turn-around time between the LSI design and the test pattern formation.

It is a further object of the present invention to provide an event based semiconductor test system which is capable of producing a test pattern for testing an LSI device under test by directly using the event based simulation data created based on the CAD data derived from the design stage of the intended LSI device under test, thereby being able to simplify the software and hardware involved in the semiconductor test system.

It is a further object of the present invention to provide an event based semiconductor test system which is directly related to the EDA research and design environment of the LSI device under test, and which can test the LSI device under test by a test pattern produced directly from the design data, and which can directly feedback the test result to the EDA research and design environment.

It is a further object of the present invention to provide an event based semiconductor test system which is capable of producing a test pattern for testing an LSI device under test by directly using the event based simulation data created based on the CAD data derived from the design stage of the intended LSI device under test, thereby being able to decrease the test cost and increase the test efficiency.

In the semiconductor test system of the present invention, the test pattern is produced by directly using dump file data which is the event based data obtained through executing the device logic simulation on the LSI device designed in the electronic design automation (EDA) environment. The device test is conducted by applying the test pattern thus produced to the LSI device under test, and evaluation of the designed LSI device is feedbacked to the EDA environment based on the test result.

In the semiconductor test system of the present invention, the semiconductor device test is performed with high test efficiency by directly using the data obtained through executing the device logic simulation on the LSI device designed with the aid of computer in the electronic design automation (EDA) environment. The semiconductor test system includes a compiler for converting event data obtained by executing device logic simulation in a design stage of an LSI device under test to an object code; an event file for storing the event data converted by the compiler; an event memory for storing the event data from the event file in two separate types of data, one showing an integer multiple of a reference clock cycle and the other showing fractions of the reference clock cycle; means for generating a test pattern based on the event data from the event memory and applying the test pattern to the LSI device under test; a result data file for evaluating a response output of the LSI device under test and storing resultant evaluation data; and means for evaluating design of the LSI device based on the data stored in the result data file.

As described in the foregoing, in the semiconductor test system of the present invention, the test pattern is produced by directly using the logic simulation data of the device under test obtained in the design stage of the device in the electronic design automation (EDA) environment. The device test is conducted by applying the test pattern thus produced to the device under test. In the semiconductor test system of the present invention, the event based simulation data produced from the CAD design data created in the design stage of the LSI device can be directly used to form the test pattern to test the LSI device.

Thus, according to the semiconductor test system of the present invention, it is possible to significantly reduce the turnaround time from the LSI design to the test pattern production. Further, the test system can be configured by the hardware and software of significantly simple forms. Moreover, since the logic simulation in the design stage of the device and the test pattern applied to the device are structured based on the same basic idea, the test result can be directly feedbacked to the EDA design environment. Further, in the semiconductor test system of the present invention, the device test can be conducted with low test cost and high test efficiency.

DETAILED DESCRIPTION OF THE PREFERRED EMBODIMENT

Figure 5:
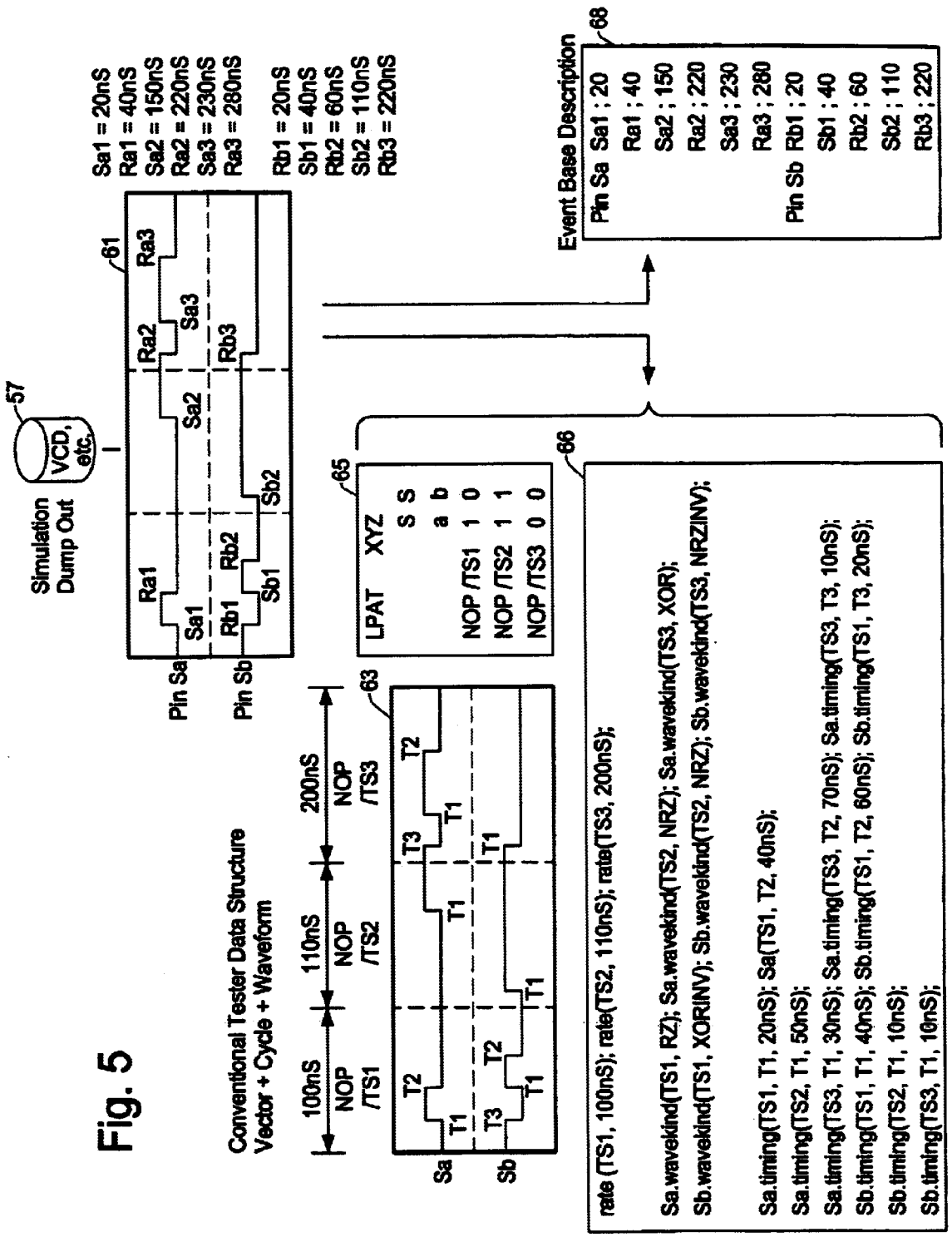
FIG. 5 is a diagram for comparing an example of descriptions for producing a cycle based test pattern in the conventional semiconductor test system with an example of descriptions for producing an event based test pattern in the semiconductor test system of the present invention.

The embodiment of the present invention and the difference from the conventional technology are explained with reference to the drawings. FIG. 5 is a diagram for comparing an example of descriptions for producing a cycle based test pattern in the conventional semiconductor test system with an example of descriptions for producing an event based test pattern in the semiconductor test system of the present invention.

The dump file 57 storing the resultant data of the logic simulation produced in the design stage of the integrated circuit is shown in an upper part of FIG. 5. A typical example of the dump file is VCD (Value Change Dump) of Verilog. The output of the dump file is data in the event base format showing the changes in the input and output of the designed LSI device and having descriptions for expressing, for example, the waveforms 61 in FIG. 5. In this example, it is assumed that test patterns such as shown by the waveform 61 are to be formed. The waveforms 61 illustrate test patterns generated by pins (tester pins or test channels) Sa and Sb, respectively. The event data describing the waveforms is formed of set edges Sa, Sb and their timings (for example, time lengths from a reference point), and reset edges Ra, Rb and their timings.

For producing a cycle base test pattern to be used in the conventional semiconductor test system based on the dump data from the dump file, the dump data must be converted to descriptions showing test cycles (tester rate), waveforms (types of waveforms, and edge timings), and vectors. An example of such descriptions is shown in the center and left of FIG. 5. In the cycle based test pattern, as shown by waveforms 63 in the left part of FIG. 5, a test pattern is divided into each test cycle (TS1, TS2 and TS3) to define the waveform and timing for each test cycle.

An example of data descriptions for such waveforms, timings and test cycles is shown in timing data (test plan) 66. An example of logic "1", "0" or "Z" of the waveforms is shown in vector data (pattern data) 65. For example, in the timing data 66, the test cycle is described by "rate", to define time intervals between test cycles, and the waveform is described by RZ (return to zero), NRZ (non-return to zero) and XOR (exclusive OR). Further, the timing of each waveform is defined by a delay time from a predetermined edge of the corresponding test cycle.

In contrast, it is very simple to form an event based test pattern to be used in the event base semiconductor test system based on the dump data from the dump file. This is because the dump data is described in the event format. It is apparent that the event data 68 shown in the lower right of FIG. 5 can be derived directly from the dump data shown in the upper part of FIG. 5.

Figure 6:
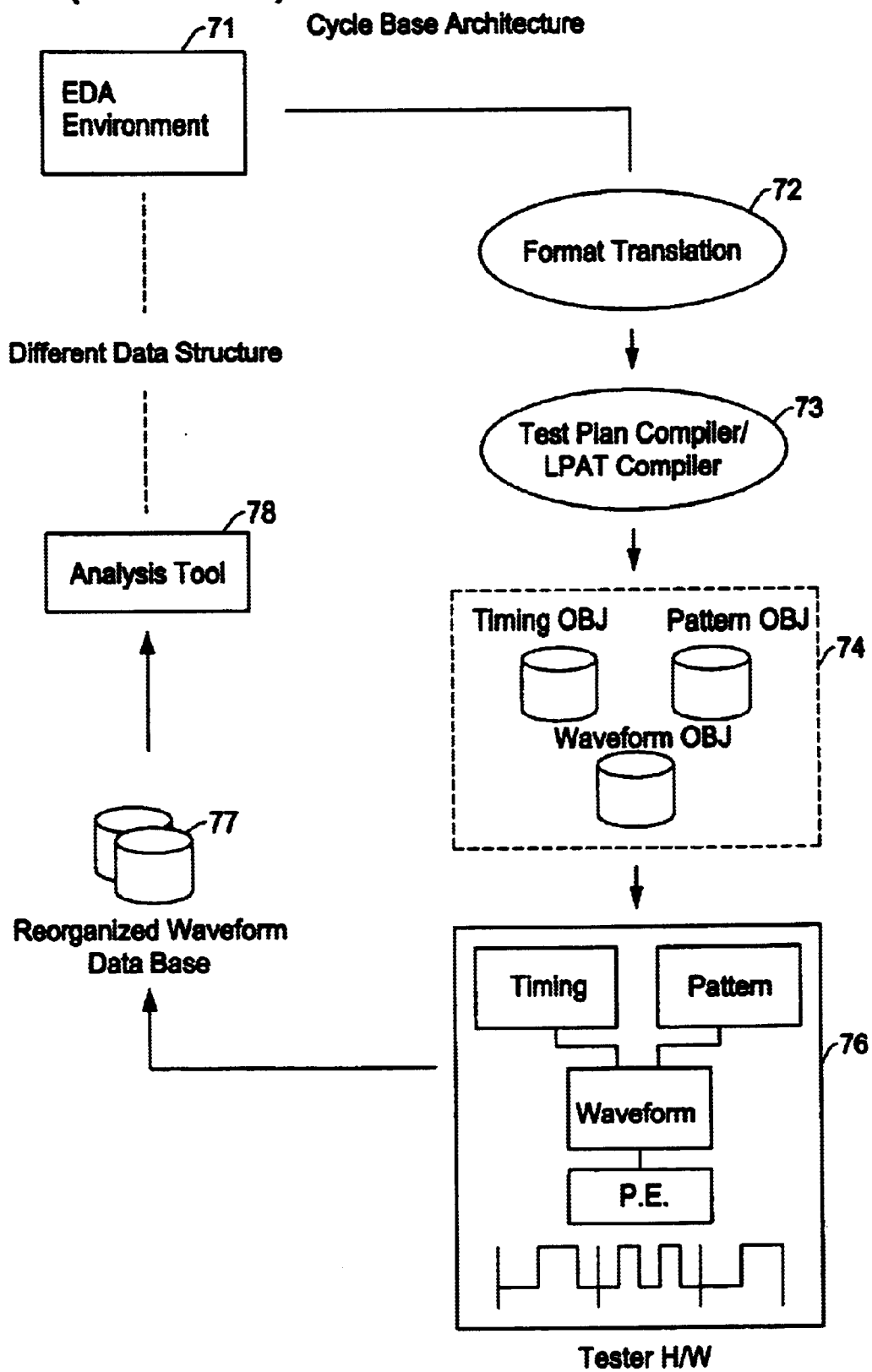
FIG. 6 is a block diagram showing a relationship, mainly by the required software, between the EDA environment and the test system for producing a cycle based test pattern, by the conventional semiconductor test system, based on the LSI design evaluation data obtained in the EDA environment.

FIG. 6 shows a relationship, mainly by the required software, between the EDA environment and the test system for producing a cycle based test pattern, by the conventional semiconductor test system, based on the LSI design evaluation data obtained in the EDA environment. LSI design evaluation data obtained in the EDA environment 71 is converted to cycle based data by a conversion software 72. The converted data is further converted to object codes by a compiler 73 so that an object file 74 is created. The object file 74 includes, for example, timing object codes, pattern object codes, and waveform object codes.

An appropriate amount of data in the object file 74 is transferred to a timing memory and a waveform memory provided in the pattern memory of the LSI tester and stored therein. The data stored in the memories has the cycle base format as shown in FIG. 5. When testing the semiconductor device under test, the data is extracted from the memories, and thus the test pattern is produced. The test pattern is applied to the semiconductor device under test through pin electronics (PE) of the LSI tester.

The resultant test data is stored in, for example, a failure memory (not shown). If necessary, the waveforms in the test result data may be reorganized and stored in a waveform data file 77 and is used to failure analysis by a failure analysis tool 78. The result of the failure analysis is feedbacked to the EDA design environment. As described in the foregoing, since the data obtained through the EDA design environment 71 has a structure different from the data structure to be used in the semiconductor test system 76, various types of software for conducting conversion of the data structure are necessary. Further, because of the difference in the data structure, it is difficult to utilize the data feedbacked to the EDA design environment 71.

Figure 7:
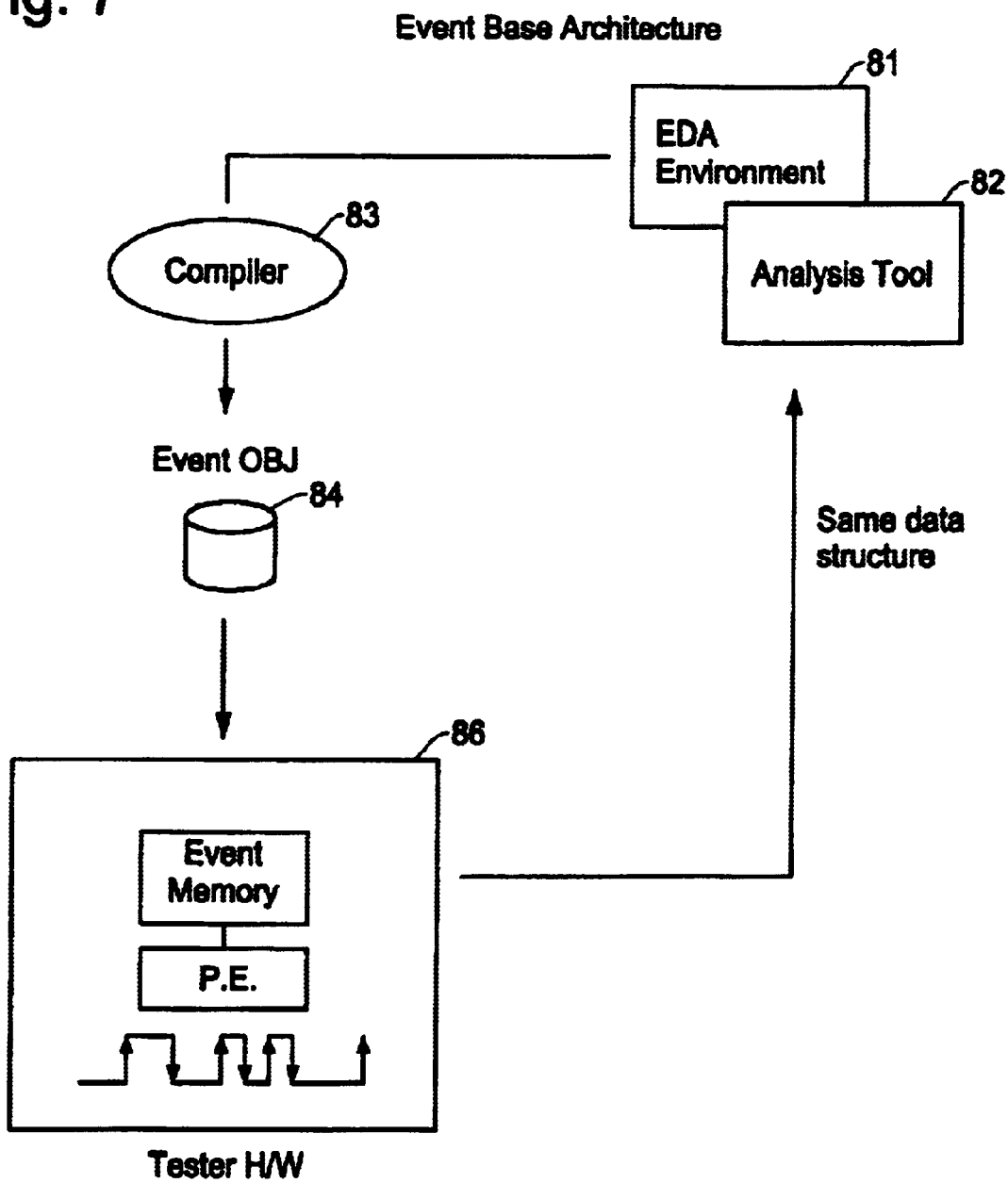
FIG. 7 is a block diagram showing a relationship between the EDA environment and the event based test system of the present invention, mainly by the required software, for comparing with the conventional technology of FIG. 6.

FIG. 7 shows a relationship between the EDA design environment and the event based test system of the present invention for comparing with the conventional technology of FIG. 6. In the event based semiconductor test system, the dump output data obtained in the EDA design environment 81 is directly compiled by a compiler 83 to produce object codes. The event object codes are stored in a file 84, and a necessary amount thereof is transferred to an event memory in the test system 86.

The event data stored in the event memory has a form of description as shown in FIG. 5, which is a simple list of set and reset and their timings. Thus, test patterns are easily formed by using the data from the event memory. The test result data produced when the test pattern is applied to the device under test can be directly used by a failure analysis tool 82 as a failure analysis purpose. Therefore, the failure analysis result is directly feedbacked to the EDA design environment 81. In this manner, in the event based test system of the present invention, the test pattern can be produced with use of an extremely simple and small amount of software. Further, since the test pattern is generated by simply producing the sets and resets based on the event data, the hardware in the test system produced is also greatly simplified.

Thus, according to the event based test system of the present invention, the cost of the hardware and software for generating the test pattern can be substantially reduced. In addition, the test pattern produced by the test system matches the test pattern produced by; the design data, thus, efficiency of detecting the defects of the device under test (efficiency of debugging) is increased. Moreover, since the event based simulation data produced in the design stage of the device can be directly used to generate the test pattern for testing the device under test, it is possible to significantly reduce a turnaround time from the LSI design to the test pattern production.

Figure 8:
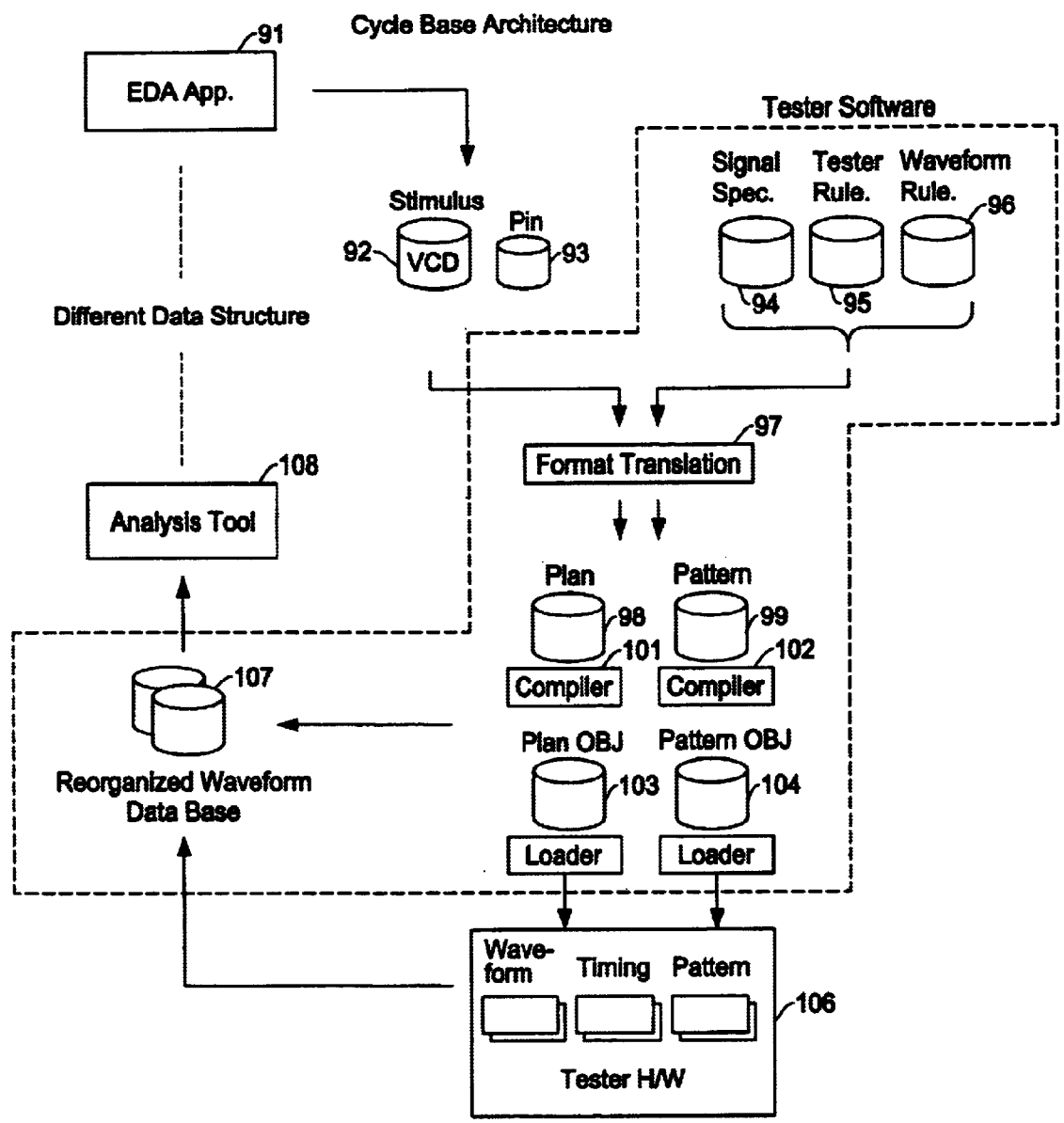
FIG. 8 is a block diagram showing, in more detail, a relationship, mainly by the required software, between the EDA environment and the test system for producing a cycle based test pattern, by the conventional semiconductor test system, based on the LSI design evaluation data obtained in the EDA environment.
Figure 9:
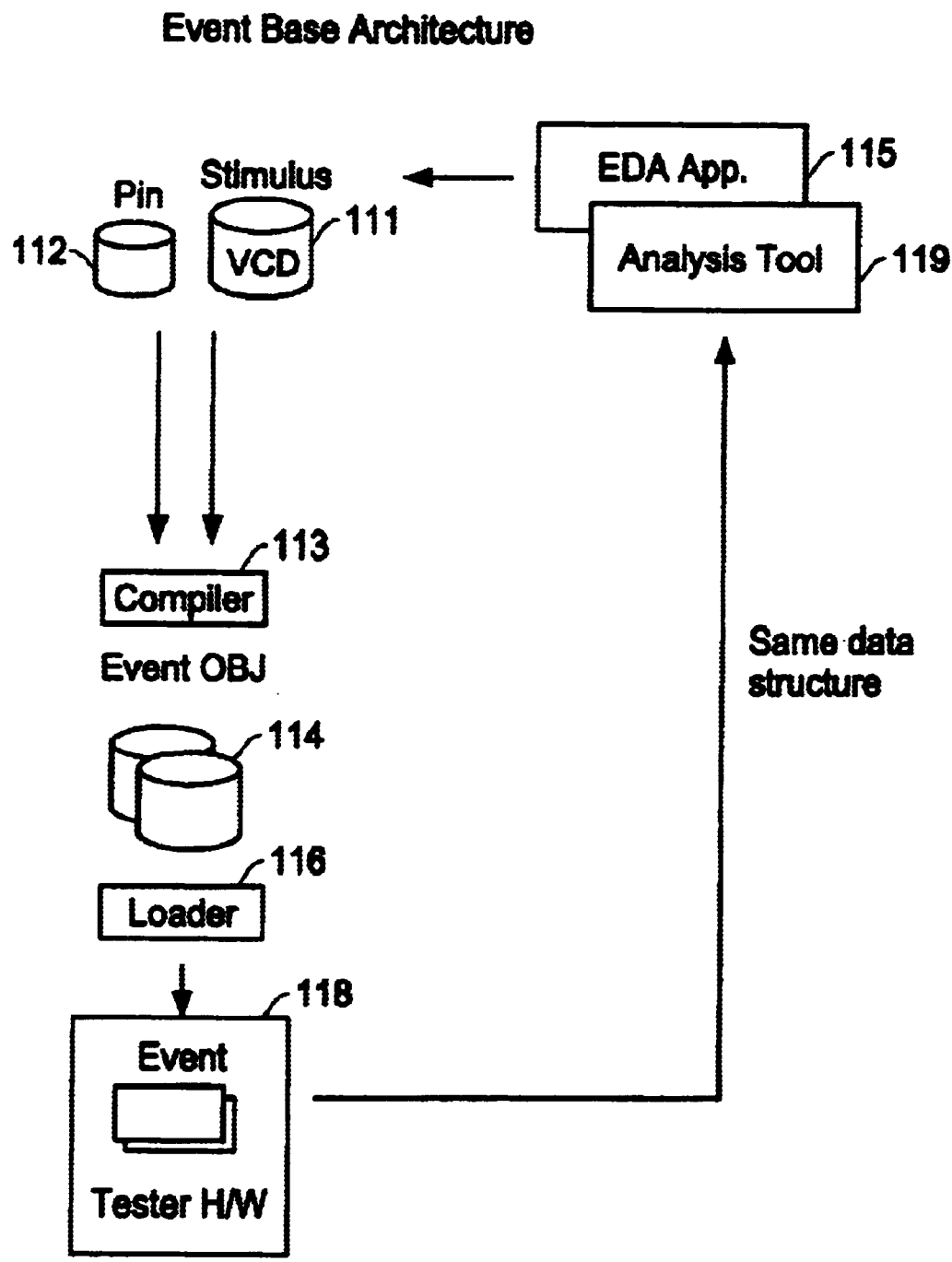
FIG. 9 is a block diagram showing a relationship between the EDA environment and the event based test system of the present invention, mainly by required software, for comparing with the conventional technology of FIG. 8.

The relationship between the situations shown in FIGS. 8 and 9 is similar to that between FIGS. 6 and 7, however, software involved between the EDA environment and the LSI tester are described in more detail. FIG. 8 is a block diagram showing software between the EDA environment and the test system which are necessary for producing the cycle based test pattern, by the conventional semiconductor test system, based on the LSI design evaluation data obtained in the EDA environment.

In the example of FIG. 8, the design validation data of the LSI obtained in the EDA environment 91 is stored in a dump file 92. The data from the dump file 92 and data from a pin data file 93 concerning pin arrangements of the semiconductor test system 106 are given to a conversion software 97 whereby converted to the cycle based data. Further, data describing various specifications of the test system from data files 94, 95 and 96 are given to conversion software 97 and thus converted to the cycle based data.

Through this procedure, a test plan file 98 and a test pattern file 99 are created. Within the context of this patent specification, the test plan data is basically the same as the timing data which describes test pattern waveforms, test cycles, and timings of the waveforms as shown in FIG. 5. The pattern data describes vectors in the test pattern. The converted data noted above is further converted to object codes by compilers 101 and 102, thereby forming object code files 103 and 104. The data in the object code files 103 and 104 are transferred to corresponding memories (waveform, timing, and pattern memories) in the test system (LSI tester) 106 by a loader.

The data stored in the waveform, timing and pattern memories in the LSI tester 106 has a cycle based data structure such as shown in FIG. 5. When testing the device under test, the data is read from these memories, thereby producing a test pattern. The test pattern is applied to the device under test via pin electronics (PE).

Similar to the case of FIG. 6, the test result data is stored in a fail memory (not shown). The test result data is reorganized in a data file 107 to show input and output waveforms, which are similar to the event based data. The data from the file 107 is used in the failure analysis by a analysis tool 108. The result of the failure analysis is feedbacked to the EDA environment 91, however, the failure analysis result cannot be directly used there because the data structures are different from one another.

As described in the foregoing, because the data obtained from the EDA design environment 91 and the data used in the semiconductor test system 106 are different in the data structure, various software must be used for the data conversion. Especially, the software in a dotted line area are required for the data conversion in the cycle based system. All of these software are unnecessary in the event based LSI tester of the present invention.

Similar to the case of FIG. 7, FIG. 9 is a block diagram showing the event based semiconductor test system of the present invention in, comparison with the cycle based semiconductor test system in the conventional technology of FIGS. 6 and 8. In the event based semiconductor test system, the dump output data of a dump file 111 obtained in the EDA design environment 115 and pin information from the pin data file 112 are directly compiled by a compiler 113 to produce object codes. The event object codes are stored in a file 114, and a necessary amount thereof is transferred to an event memory in the test system 118 through a loader.

The event data stored in the event memory has a form of description as shown in FIG. 5, which is a simple list of set and reset and their timings. Thus, test patterns are easily formed by using the data from the event memory. The test result data produced when the test pattern is applied to the device under test can be directly used by a failure analysis tool 119 as a failure analysis purpose. Therefore, the failure analysis result is directly feedbacked to the EDA design environment 115.

In this manner, in the event based test system of the present invention, the test pattern can be produced with use of an extremely simple and small amount of software. Namely, the software necessary in the conventional technology of FIG. 8 shown in the dotted line area are completely unnecessary in the test system of the present invention shown in FIG. 9. Further, since the test pattern is generated by simply producing the sets and resets based on the event data, the hardware in the test system produced is also greatly simplified.

Thus, according to the event based test system of the present invention, the cost of the hardware and software for generating the test pattern can be substantially reduced. In addition, the test pattern produced by the test system matches the test pattern produced by the design data, thus, efficiency of detecting defects of the device under test (efficiency of debugging) is increased. Moreover, since the event based simulation data produced in the design stage of the device can be directly used to generate the test pattern for testing the device under test, it is possible to significantly reduce a turnaround time from the LSI design to the test pattern production.

Figure 1:
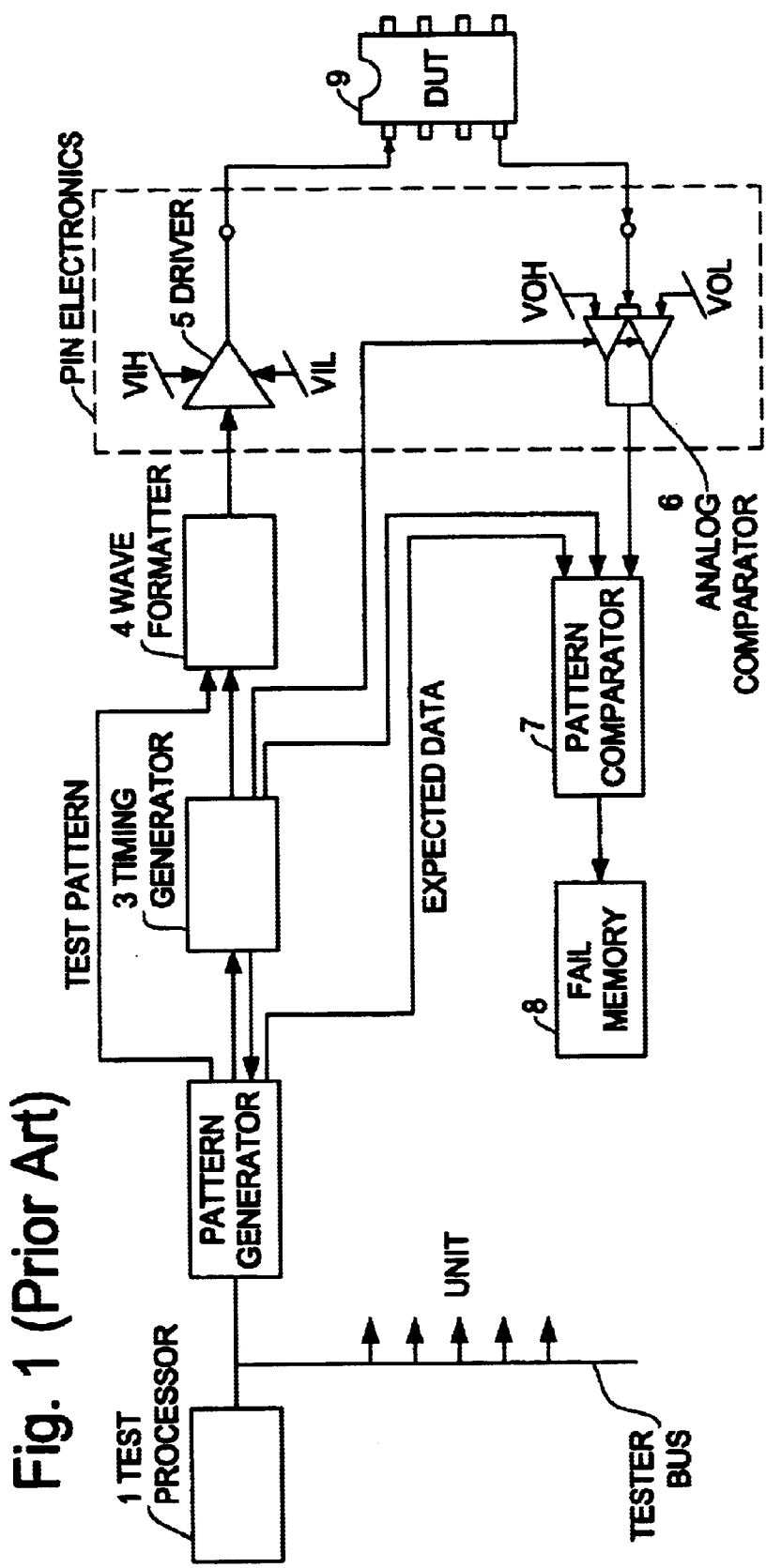
FIG. 1 is a block diagram showing a basic configuration of a semiconductor test system (LSI tester) in the conventional technology.
Figure 2:
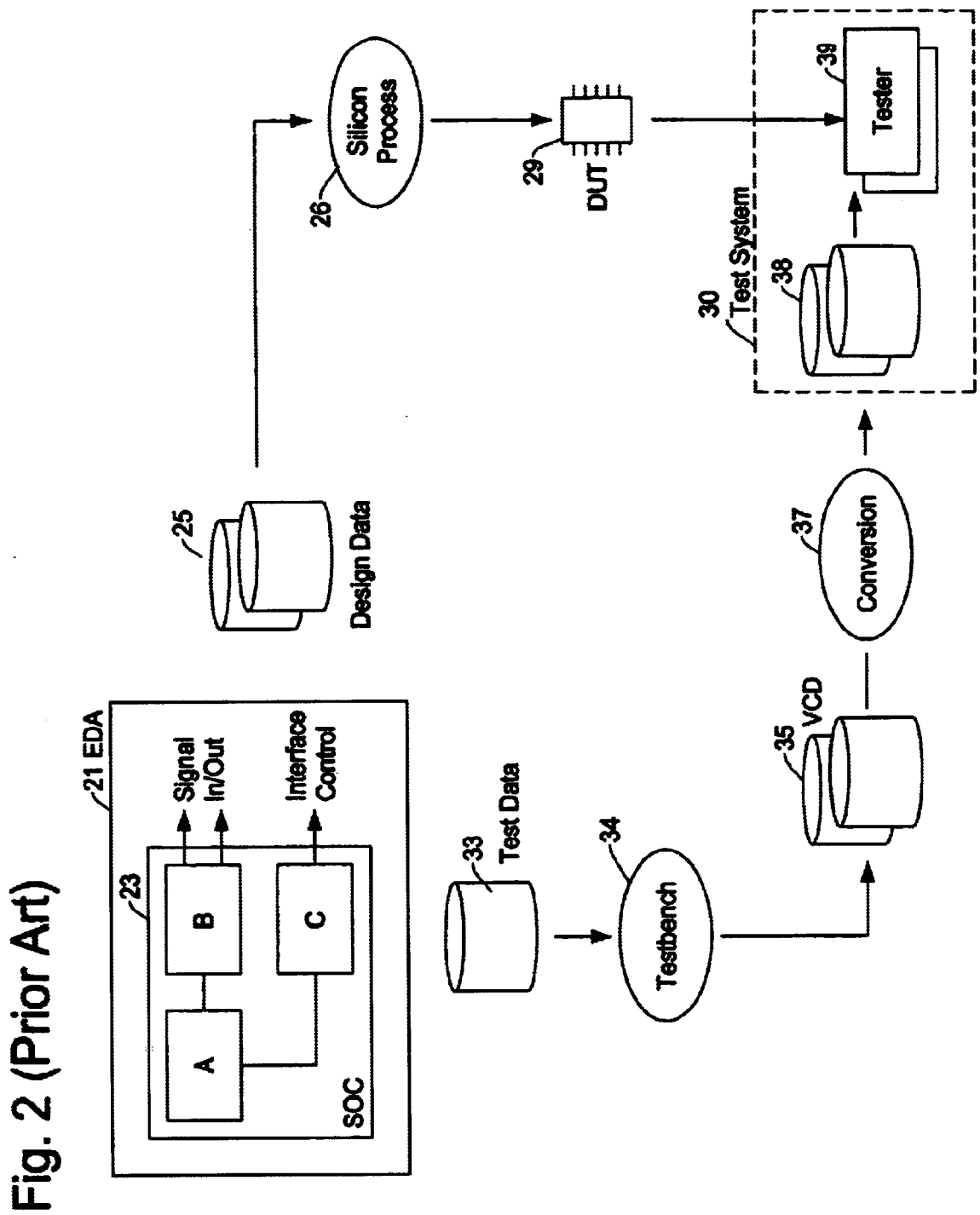
FIG. 2 is a schematic diagram showing an overall relationship for testing an LSI by the conventional semiconductor test system using a dump file resulted from performing logic simulation on the LSI design data obtained through a CAD system in an EDA environment.
Figure 3:
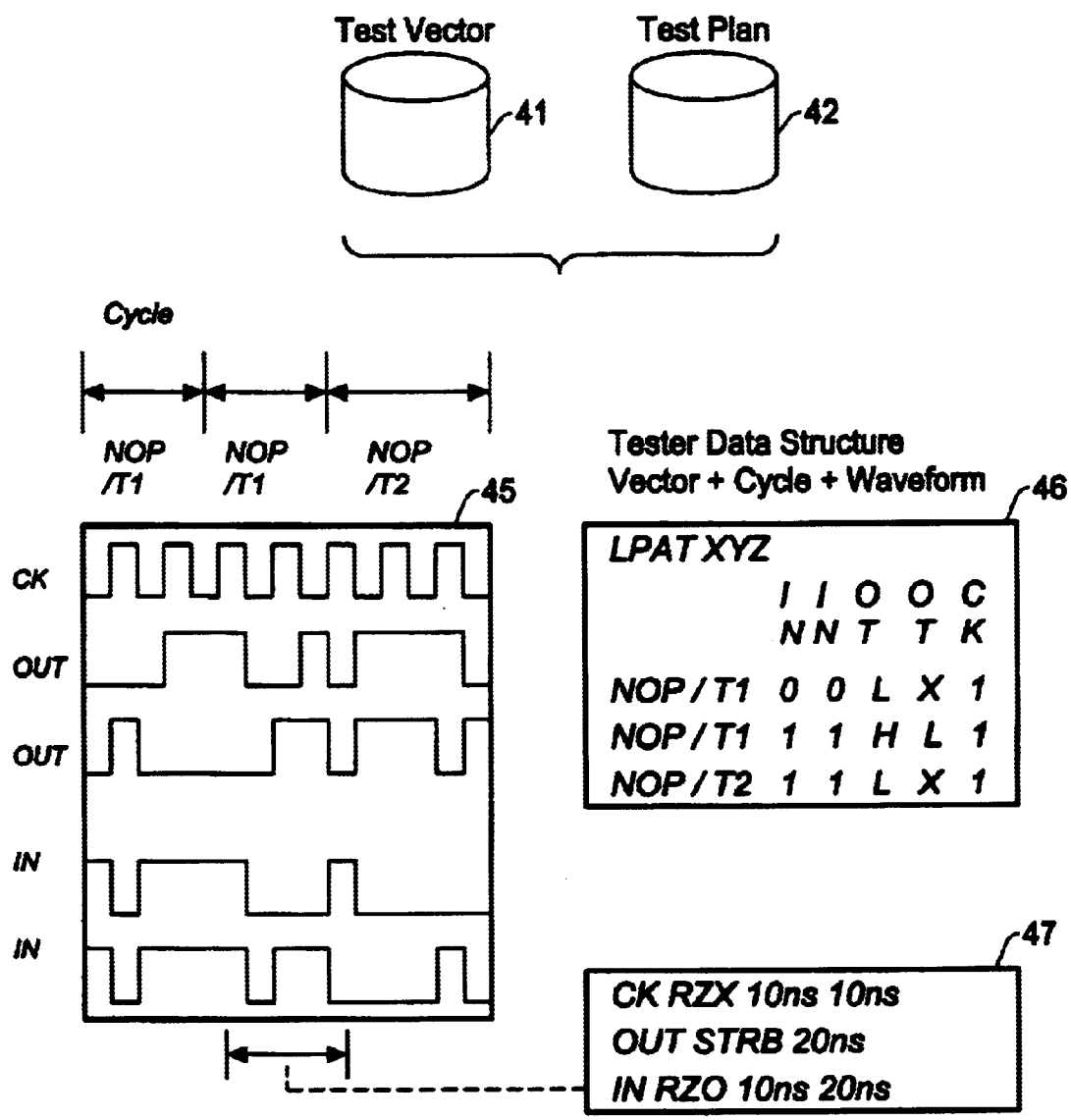
FIG. 3 is a schematic diagram showing an example of descriptions in the pattern data and timing data for producing a test pattern in a cycle base format by the conventional semiconductor test system.
Figure 4:
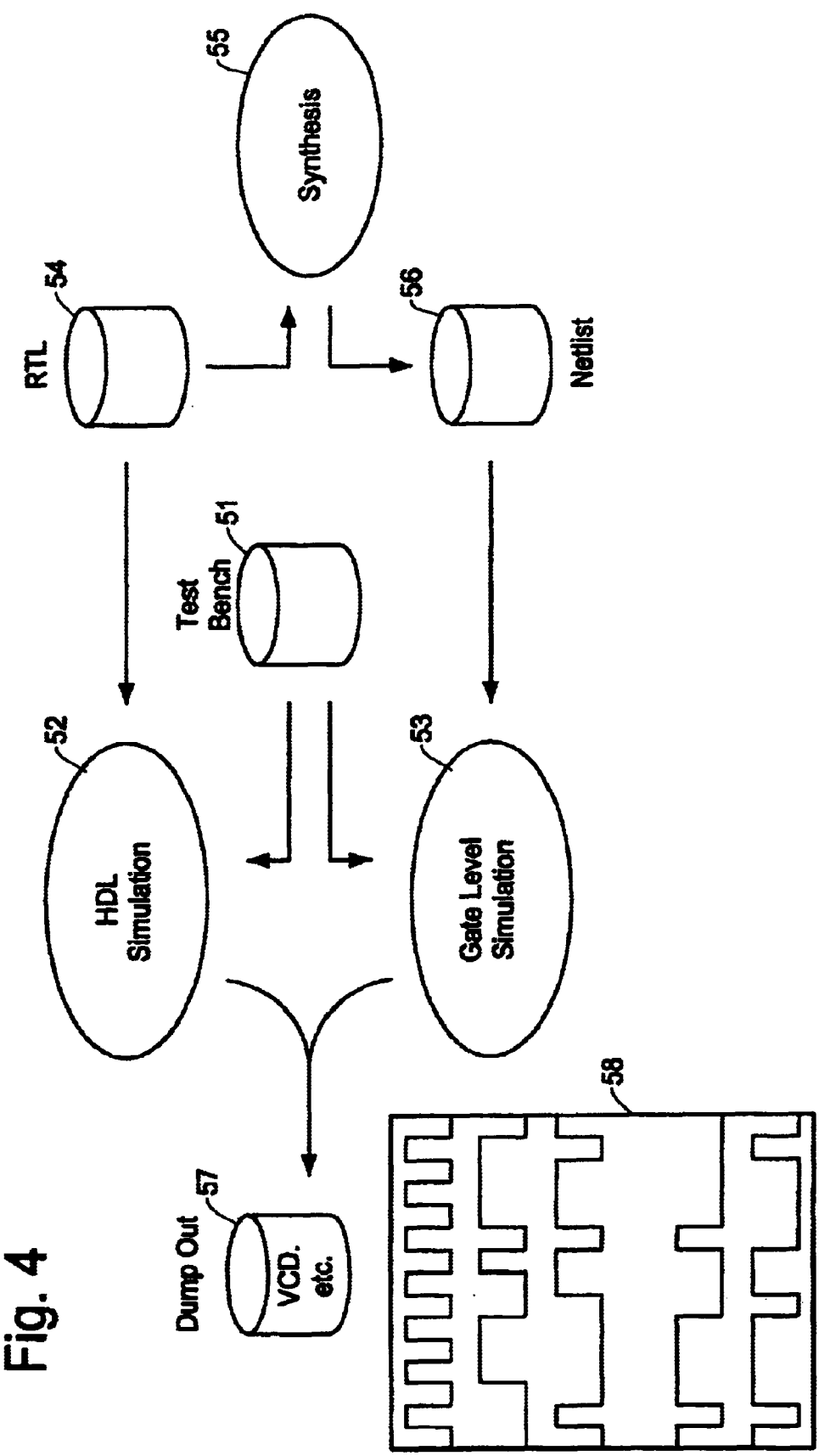
FIG. 4 is a block diagram showing a process for producing a dump file by performing logic simulation on the LSI design data obtained in the EDA environment and showing an image of event based waveforms described in the data obtained in the dump file.
Figure 10:
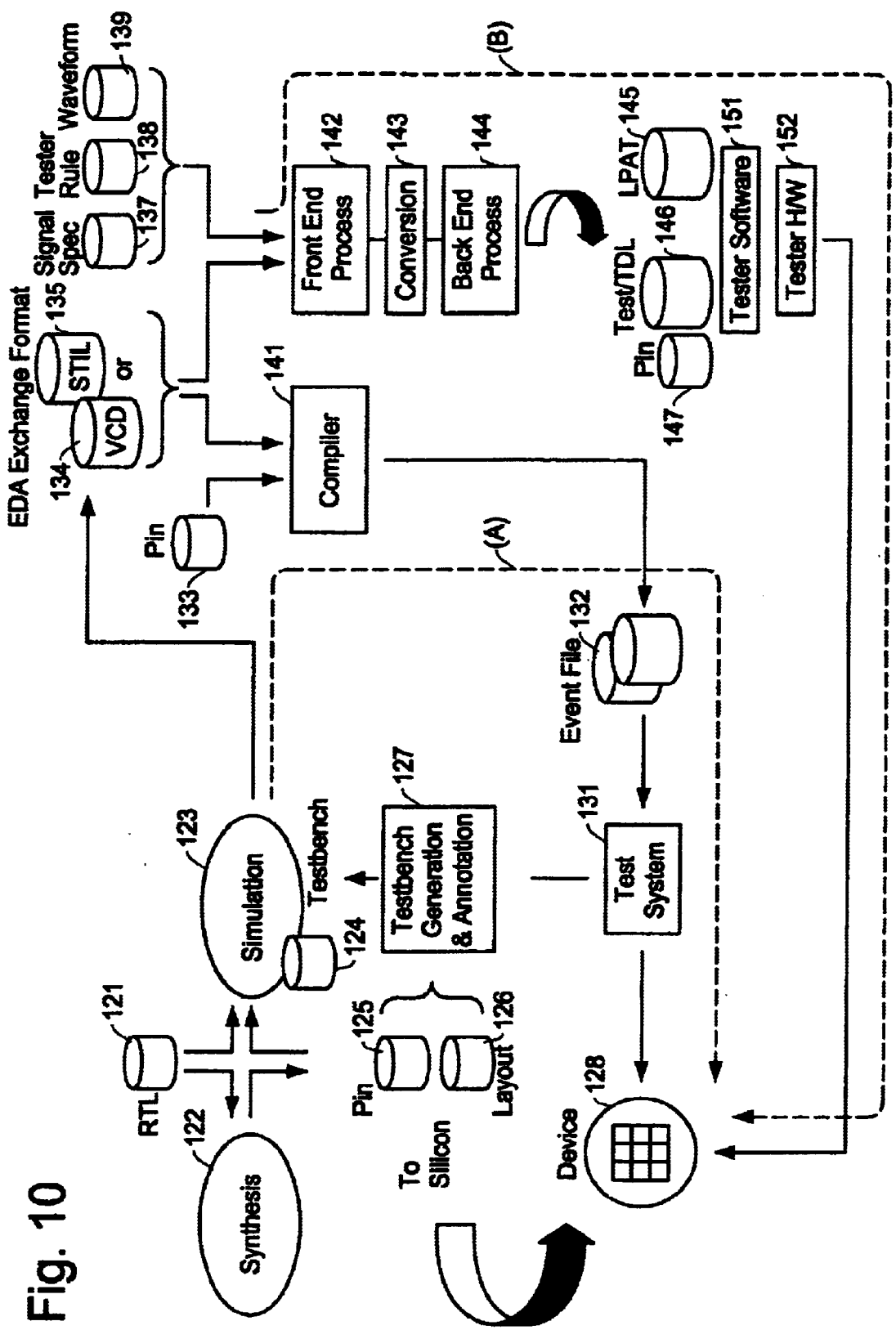
FIG. 10 is a block diagram for comparing semiconductor test system in the conventional technology and the semiconductor test system in the present invention for generating a test pattern and testing a device under test based on the LSI design evaluation data obtained in the EDA environment.

FIG. 10 is a block diagram basically showing a situation where the cycle based architecture of FIG. 8 and the event based architecture of FIG. 9 are combined to show more clearly the difference between the present invention from the conventional technology. In FIG. 10, the block diagram showing the EDA environment is almost the same as that of the block diagram of FIG. 4. Namely, an RTL file 121 storing the design data in the register transfer language (RTL) is converted to a pin data file 125 and a layout data file 126 by a conversion software 122. Based on the converted design data, an integrated circuit 128 is produced through a semiconductor production process (silicon process).

Further, through a process 127 for extracting data from each of the design data, a testbench 124 is created. The testbench provides test vectors to a device model in the design data, thereby performing a logic simulation process 123. A VCD file 134 which is a dump file resulted from the logic simulation (and an STIL file having a data structure similar to the event base) and a pin data file 133 storing the pin information of the test system are used to produce a test pattern. An example of dump file is a VCD (value change dump) such as by VCD/Verilog. STIL stands for "standard test interface language" by IEEE.

In the present invention, the test pattern is produced based on a process shown by a dotted line (A). Namely, the dump data and the pin data are converted to the object codes by a compiler 141, resulting in an event file 132. The event data stored in the event file 132 is transferred to an event memory in the test system 131. Thus, the test system 131 generates the event based test pattern, thereby testing the device under test 128.

In contrast, in the procedure using the conventional semiconductor test system, the test pattern is produced through a route shown by a dotted line (B). Namely, the data from the dump files 134 and 135 and the data from files 137–139 storing various specifications and conditions of the test system are processed through a pre-process 142 to extract information necessary to form the cycle based data. In this process, the event based data is divided into each test cycle so that waveform data and timing data within the corresponding test cycle are produced.

The data obtained in the above process is converted into the format of the test system 152 by a conversion software 143, which is a format of describing the waveforms, timings and vectors of the test pattern, i.e., the cycle format data. Further, through a post-process 144, the resultant data is further converted to the language specific to the test system, thereby forming test pattern files 145, 146 and 147. The test pattern data from these pattern files are loaded in the test system 152 through a tester software (including a compiler). Thus, the test system 152 generates the test pattern based on the received data and tests the device under test 128.

As in the foregoing, in the test system of the present invention, the EDA environment and the test system can be directly coupled to one another as shown in the route of the dotted line (A). Only the software involved during the route is the compiler 141, i.e, no conversion software for converting the data structure to the cycle based data. On the other hand, the test system in the conventional technology requires a variety of software between the EDA environment and the test system in the route shown by the dotted line (B). Moreover, because the conversion from the event based data structure to the cycle based data structure cannot always be perfectly possible, conversion errors may arise, resulting in insufficient device evaluation.

Figure 11:
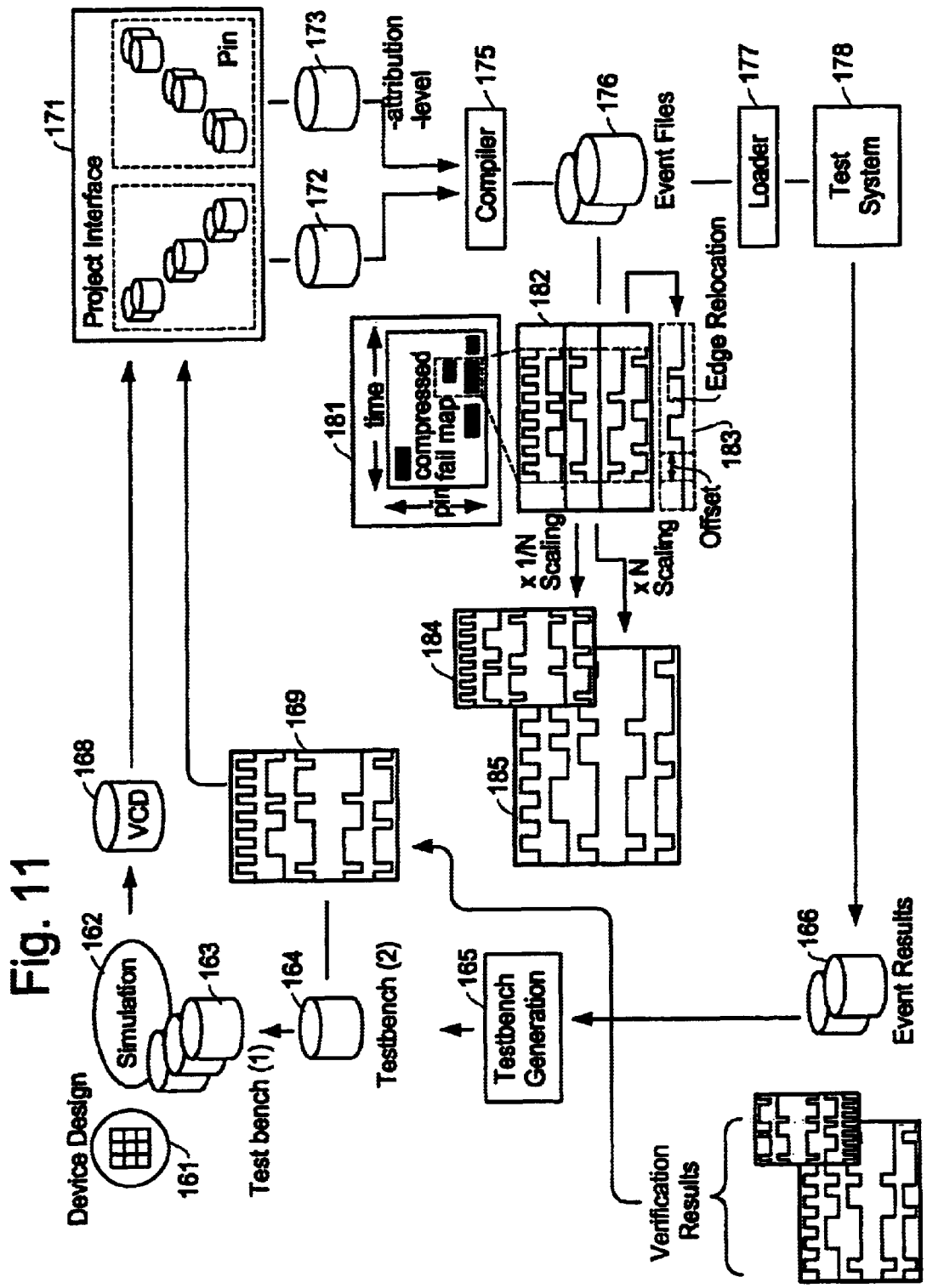
FIG. 11 is a block diagram showing functions of the semiconductor test system of the present invention and an overall relationship between the test system of the present invention with the EDA environment for generating a test pattern and testing a device under test based on the LSI design evaluation data obtained in the EDA environment.

FIG. 11 is shows functions of the semiconductor test system of the present invention and an overall relationship between the test system of the present invention with the EDA environment for generating a test pattern and testing the device under test based on the LSI design evaluation data obtained in the EDA environment. Especially, FIG. 11 shows functions of the test system of the present invention for displaying the event data as well as modifying each parameter in the event data.

By executing a logic simulation process 162 on the LSI design data 161 with use of a testbench 163 (by a third party) or a testbench 164 (created for a tester), a dump file 168 is produced. Through an interface 171, files 172 and 173 are created by assigning the event data from the dump file 168 or event data 169 from the testbench 164 to each test pin and defining a signal level of each event. The data from the files 172 and 173 are converted to object codes by a compiler 175, thereby forming an event file 176.

When conducting a test on the device, the event data is transferred from the file 76 to test system 178 by a loader 177. Based on the event data stored in an event memory, the test system 178 generates an event based test pattern, thereby executing the test on the device under test. The test result is accumulated in a test result file 166 to be used in, for example, failure analysis. The test result accumulated in this manner can be feedbacked to the testbench through a testbench generator 165.

As in the foregoing, the event data formed in the event file directly describes the test pattern to be applied to the device under test. Therefore, with use of the event data, through graphic user interface (GUI), the pattern sequence identical to the actual test pattern can be displayed and even modified. For example, an overall image 181 showing the test pattern and the test pins, an enlarged view 182 of a portion of the test pattern, views 184 and 185 showing the timings which are decreased (184) or increased (185) by a predetermined factor, an offset image 183 in which the timing (or position) of the specific event is changed, and etc. Such changes in the parameters on the display can be done by modifying the data in the event file through the GUI in real time, which also changes the actual test pattern applied to the device under test and thus enables to monitor the resultant response of the device under test. In the conventional technology, however, it is not possible to change the test pattern unless the test program is modified because of the complicated data format used in the cycle based test system. The more detailed description regarding the increase/decrease of the timing data (scaling) is given in U.S. patent application Ser. No. 09/286,226, now U.S. Pat. No. 6,557,133, owned by the same assignee of this invention.

Figure 12:
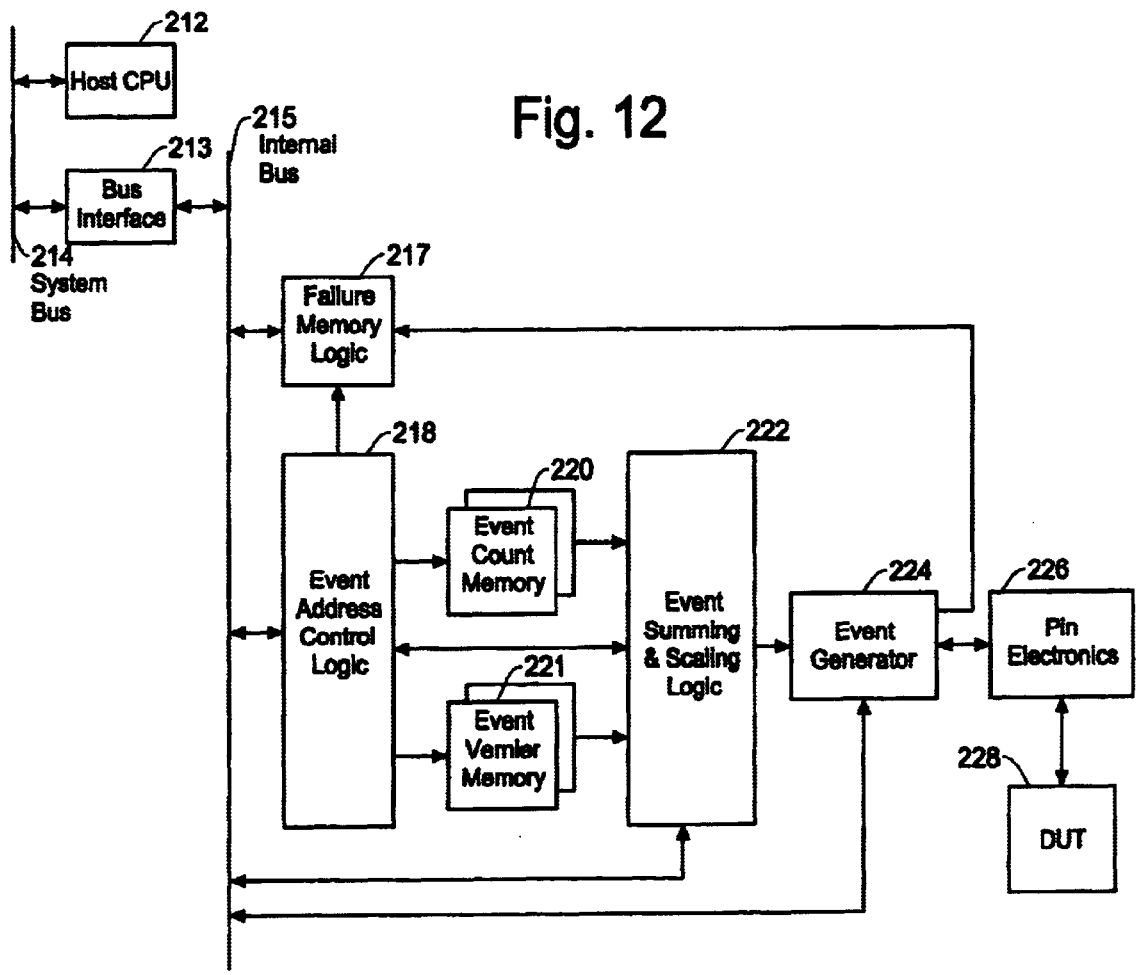
FIG. 12 is a block diagram showing an example of configuration in the event based semiconductor test system of the present invention.

FIG. 12 is a block diagram showing an example of configuration in the event based semiconductor test system of the present invention. The more detailed description regarding this test system is given in the above U.S. patent application as well as U.S. patent application Ser. No. 09/259,401, now U.S. Pat. No. 6,360,343 owned by the same assignee of this invention. In FIG. 12, a host computer 212 is a work station based on, for example, UNIX, and functions as a user interface. The host computer 212 and the hardware in the test system are connected with one another through an interface bus 213.

An address controller 218 is, for example, a tester processor for controlling the test system. In the example of FIG. 12, the address controller 218 controls the address supplied to event memories 220 and 221. The event data is transferred to the event memories 220 and 221 from the host computer as a test program. For example, the event memory 220 stores event timing data showing integer multiples of a reference clock cycle while the event memory 221 stores the event data showing fractions of the reference clock cycle. A summing and scaling 222 produces time length data of each event by summing or modifying the timing data from the event memories 220 and 221. The time length data express the timing of each event by a time length (delay time) from a predetermined reference point. An event generator 224 produces a test pattern based on the time length data and provides the test pattern to the device under test 228 through a pin electronics 226. The device 228 is tested by evaluating the response output thereof.

As described in the foregoing, in the semiconductor test system of the present invention, the test pattern is produced by directly using the logic simulation data of the device under test obtained in the design stage of the device in the electronic design automation (EDA) environment. The device test is conducted by applying the test pattern thus produced to the device under test. In the semiconductor test system of the present invention, the event based simulation data produced from the CAD design data created in the design stage of the LSI device can be directly used to form the test pattern to test the LSI device.

Thus, according to the semiconductor test system of the present invention, it is possible to significantly reduce the turnaround time from the LSI design to the test pattern production. Further, the test system can be configured by the hardware and software of significantly simple forms. Moreover, since the logic simulation in the design stage of the device and the test pattern applied to the device are structured based on the same basic idea, the test result can be directly feedbacked to the EDA design environment. Further, in the semiconductor test system of the present invention, the device test can be conducted with low test cost and high test efficiency.

What is claimed is:

1. A semiconductor test system, comprising:
  an event file for storing event data obtained by executing device logic simulation in a design stage of an LSI device under test on design data of the LSI device;
  an event memory for storing the event data obtained directly from the event file in two separate types of data, one showing an integer multiple of a reference clock cycle and the other showing fractions of the reference clock cycle;
  means for generating a test pattern by directly using the event data from the event memory and applying the test pattern to the LSI device under test;
  means for displaying the test pattern applied to the LSI device under test and changing the test pattern by partially modifying the event data in the event file in real time, wherein such chances in the test pattern include a change of a particular timing of an event;

a result data file for storing a response output of the LSI device under test; and means for evaluating design of the LSI device based on the data stored in the result data file and producing a testbench based on results of the evaluation for executing device logic simulation in the design stage of the LSI device under test, thereby incorporating the test results in the design of the LSI device.

2. A semiconductor test system as defined in claim 1, wherein the event data describes a series of ON-OFF changes in input and output signals in a specified location of the LSI device under test with respect to time lengths from a predetermined reference point.

3. A semiconductor test system as defined in claim 1, further comprising a compiler for compiling the event data resulted from the logic simulation to produce the event data of object codes which are stored in the event file, said compiler receiving tester pin data of the semiconductor test system which are converted to object codes and stored in the event file.

4. A semiconductor test system as defined in claim 1, wherein the display means shows an overall illustration of the test pattern, an enlarged view of a part of the test pattern, timing changes in each event in the test pattern, and offset addition or removal from the test pattern in a real time fashion when the event data is changed through a graphic user interface.

5. A semiconductor test system, comprising:

means for designing an LSI device under an electric design automation (EDA) environment with aid of a computer system;

a dump file obtained by executing a logic simulation on the LSI device in the design stage thereof;

an event memory for storing the event data obtained directly from the dump file in two separate types of data, one showing an integer multiple of a reference clock cycle and the other showing fractions of the reference clock cycle;

means for generating a test pattern by directly using the event data from the event memory and applying the test pattern to the LSI device under test;

means for displaying the test pattern applied to the LSI device under test and changing the test Pattern by partially modifying the event data in the event file in real time, wherein such changes in the test pattern include a change of a particular timing of an event;

a result data file for storing a response output of the LSI device under test; and means for evaluating design of the LSI device based on the data stored in the result data file and feedbacking results of the evaluation to the EDA environment by producing a testbench based on results of the evaluation for executing device logic simulation in the EDA environment, thereby incorporating the test results in the design of the LSI device.

6. A semiconductor test system as defined in claim 5, wherein the event data describes a series of ON-OFF changes in input and output signals in a specified location of the LSI device under test with respect to time lengths from a predetermined reference point.

7. A semiconductor test system as defined in claim 5, further comprising a compiler for compiling the event data resulted from the logic simulation to produce the event data of object codes which are stored in the event file, said compiler receiving tester pin data of the semiconductor test system which are converted to object codes and stored in the event file.

8. A semiconductor test system as defined in claim 5, wherein the display means shows an overall illustration of the test pattern, an enlarged view of a part of the test pattern, timing changes in each event in the test pattern, and offset addition or removal from the test pattern in a real time fashion when the event data is changed through a graphic user interface.

\* \* \* \* \*